(12) United States Patent
Landru

(10) Patent No.: US 8,513,092 B2
(45) Date of Patent: Aug. 20, 2013

(54) METHOD FOR PRODUCING A STACK OF SEMI-CONDUCTOR THIN FILMS

(75) Inventor: Didier Landru, Champ Pres Froges (FR)

(73) Assignee: Soitec, Bernin (FR)

( * ) Notice: Subject to any disclaimer, the term of this patent is extended or adjusted under 35 U.S.C. 154(b) by 91 days.

(21) Appl. No.: 13/121,671

(22) PCT Filed: Oct. 29, 2009

(86) PCT No.: PCT/EP2009/064307
§ 371 (c)(1),
(2), (4) Date: Mar. 29, 2011

(87) PCT Pub. No.: WO2010/049496
PCT Pub. Date: May 6, 2010

(65) Prior Publication Data
US 2011/0177673 A1 Jul. 21, 2011

(30) Foreign Application Priority Data
Oct. 30, 2008 (FR) .................................. 08 57409

(51) Int. Cl.
*H01L 21/48* (2006.01)
(52) U.S. Cl.
USPC .............. 438/458; 438/459; 257/E21.568; 257/E21.569
(58) Field of Classification Search
USPC ............ 257/E21.568, E21.569; 438/458, 438/459
See application file for complete search history.

(56) References Cited

U.S. PATENT DOCUMENTS

| 7,091,107 B2 * | 8/2006 | Yokokawa et al. .......... 438/455 |
| 2005/0014346 A1 * | 1/2005 | Mitani et al. ................ 438/459 |
| 2006/0035450 A1 | 2/2006 | Frank et al. .................... 438/585 |
| 2006/0086313 A1 * | 4/2006 | Sakurada ........................ 117/89 |
| 2007/0170503 A1 | 7/2007 | Allibert et al. ................ 257/347 |
| 2008/0014713 A1 | 1/2008 | Neyret et al. ................. 438/455 |
| 2008/0014718 A1 | 1/2008 | Neyret et al. ................. 438/459 |
| 2009/0032911 A1 | 2/2009 | Kononchuk .................. 257/647 |
| 2009/0035920 A1 * | 2/2009 | Neyret et al. ................. 438/458 |
| 2010/0044830 A1 * | 2/2010 | Cayrefourcq ................ 257/506 |

FOREIGN PATENT DOCUMENTS

| EP | 1 605 510 A1 | 12/2005 |
| EP | 1 811 561 A1 | 7/2007 |
| EP | 1 879 225 A1 | 1/2008 |
| WO | WO 2008/114099 A1 | 9/2008 |

OTHER PUBLICATIONS

S. Mack et al, "Analysis of Bonding-Related Gas Enclosure in Micromachined Cavities Sealed by Silicon Wafer Bonding", Journal of Electrochemical Society, vol. 144, No. 3, pp. 1106-1111, (1997).
B. Aspar and A.J. Auberton-Hervé Smart Cut®: The Technology Used for High Volume SOI Wafer Production, Chapter 3, pp. 35-51. (1995).
International Search Report, PCT/EP2009/064307, mailed Jan. 28, 2010.

* cited by examiner

*Primary Examiner* — George Fourson, III
(74) *Attorney, Agent, or Firm* — Winston & Strawn LLP

(57) ABSTRACT

A method for producing a stacked structure having an ultra thin buried oxide (UTBOX) layer therein by forming an electrical insulator layer on a donor substrate, introducing elements into the donor substrate through the insulator layer, forming an electrical insulator layer, on a second substrate, and bonding the two substrates together to form the stack, with the two insulator layers limiting the diffusion of water and forming the UTBOX layer between the two substrates at a thickness of less than 50 nm, wherein the donor oxide layer has, during bonding, a thickness at least equal to that of the bonding oxide layer.

14 Claims, 5 Drawing Sheets

METHOD FOR PRODUCING A STACK OF SEMI-CONDUCTOR THIN FILMS

This application is a 371 filing of International Patent Application PCT/EP2009/064307 filed Oct. 29, 2009.

TECHNICAL FIELD AND PRIOR ART

In the field of the manufacturing of SOI-like structures, comprising a thin film of buried oxide (less than 1 µm) contained between a thin film of semi-conductor material and a final substrate, one of the major problems that appear during the reduction of the dimensions of the oxide layer is the formation of defects at the bonding interface.

The presence of these defects may be fatal for the final semi-conductor structure. Some of these defects, hydrogen blisters, appear during temperature annealings (S. Mack et al. Journal of Electrochemical Society. Vol. 144, p. 1106, 1997).

In contact with the semi-conductor material of any of the two substrates, the molecules of water brought to the bonding interface during the molecular bonding are going to react with the materials of the substrates and produce hydrogen, or any other reaction residue species, linked to the semi-conductor material. During annealings at temperatures above 400° C., the bonded hydrogen desorbs and becomes gaseous. With the increase in temperature, the pressure increases and blisters can be formed. Hereafter, the reaction residues between water and one of the substrates that can form blisters will be grouped together under the designation "hydrogen", but may concern other gases.

The formation of blisters is not very critical for the quality of SOI type structures when the buried oxide layer and the substrates situated on either side of the buried oxide layer have high or significant thicknesses. On the other hand, the formation of these defects becomes really critical for the formation of UTBOX (Ultra Thin Buried Oxide) type structures, having an ultra thin buried oxide (BOX), thinner than 50 nm or 25 nm or 15 nm for example.

This is illustrated by FIG. 4 in which are shown, for three populations of samples, defectiveness measurements (in the Y-axis) obtained for SOI-like structures as a function of the thickness of the oxide layer, known as "BOX" (in the X-axis). The population of measurements gathered in curve A relates to the method according to the prior art and the two other populations (curves B and C) relate to methods according to the invention. Curves B and C will be interpreted hereafter, in reference with the description of the invention.

For the data referring to curve A, the samples having a "BOX" oxide thickness of 50 nm have slightly more defects than those in which the buried oxide measures nearly 140 nm. When this thickness is further reduced, close to 15 nm, the defect density becomes very critical. This shows that the production of UTBOX structures according to the known method from the prior art is difficult for thicknesses of oxide in the order of 30 nm or less.

One solution used for resolving this problem is to not carry out any treatment at temperature T strictly above 400° C.

But this solution prevents the consolidation of the bonding interface, which has to take place at a temperature above 400° C., in general around 700° C. to 1300° C. In addition, this method limits the types of processes permitted during the industrial use of the device thereby obtained, and this thus limits the applications of such a UTBOX device.

Methods for overcoming this problem are thus sought.

SUMMARY OF THE INVENTION

The aim of the invention is to overcome the above mentioned problems, namely the improvement of the defectiveness after assembly of a UTBOX type structure, in particular as regards the formation of blister type defects.

To achieve this aim, the invention proposes moving away the layer of water, appearing at the bonding interface, from the materials of substrates with which the water reacts forming a gaseous reaction product, such as hydrogen. This is done by forming, before bonding, layers of insulator material having a property of barrier to the diffusion of water, or limiting this diffusion, on each of the bonded substrates, these insulator layers being at the bonding interface and then forming a buried insulator layer. In the case of a UTBOX structure having a buried oxide based on $SiO_2$, this buried insulator layer then corresponds to the buried oxide layer.

More specifically, the invention firstly relates to a method for producing stacked UTBOX-like semi-conductor structures, said method comprising:

a) the formation of a first electrical insulator layer, forming a barrier to the diffusion of water or being capable of limiting this diffusion, known as donor oxide, on a donor substrate, b) the introduction, preceding or following the formation of the donor oxide layer, of elements into the donor substrate, forming a weakened layer, c) the formation of a second electrical insulator layer, forming a barrier to the diffusion of water or being capable of limiting this diffusion, known as bonding oxide, on a second substrate known as final substrate, d) the bonding of the two substrates, the two electrical insulator layers being brought into contact and forming together a buried insulator layer between the two substrates, known as buried oxide layer, the insulator layers being such that, during the bonding, the donor oxide layer has a thickness at least equal to that of the bonding oxide layer, the thickness of the buried insulator layer ($e_t$), being after bonding, less than 50 nm, advantageously less than 20 nm, and preferentially less than 15 nm or 12 nm.

In a method according to the invention, the insulator layers are made of a material forming a barrier to the diffusion of water or limiting this diffusion. This denomination, within the scope of this invention, signifies that apart from the degradation imposed on the donor oxide layer by the step of ion implantation, there is no treatment likely to deteriorate the quality of barrier to the diffusion of water of these insulator layers.

The insulator is preferentially a dielectric or a dielectric-like insulator, it may be a nitride layer or it may advantageously be an oxide layer, for example silicon oxide. In the following description, the example of oxide layers will be taken.

The insulator-insulator bonding thus carried out makes it possible to reduce production kinetic of hydrogen and thus limit the formation of blisters. Indeed, the molecules of $H_2O$ introduced at the bonding interface during the assembly are included between two insulator layers; before reacting with the material of one of the substrates to form hydrogen radicals, the molecules of water have to pass through these insulator layers. Thus the oxide layers, having a property of barrier to the diffusion of $H_2O$ or limiting this diffusion, slow down the formation of hydrogen and thus blisters, which improves the reliability of the semi-conductor structures thereby formed.

At least one of the insulator layers (the donor oxide and/or the bonding oxide) may be formed by deposition of insulator or by reaction with a surface of at least one of the substrates.

In a method according to the invention, the introduction of elements into the donor substrate may take place through the donor oxide layer, then, the bonding oxide layer is advantageously strictly thinner than the donor oxide layer.

Indeed, in a method according to the invention, the final oxide, or buried oxide layer, is composed of two oxide layers brought into contact. During the bonding step, in a method according to the invention, the ratio of the thicknesses of the oxide layers to be assembled may be such that the relative thickness of the oxide layer derived from the donor oxide layer is strictly greater than 50% and less than or equal to 70% or 80% or 85% or 95% of the cumulative thickness of the oxide layers to be assembled.

Advantageously, the relative thickness of the donor oxide layer to be assembled is between 60% and 85% of the cumulative thickness of the oxide layers to be assembled. Preferably, this relative thickness is between 70% and 80% of the final oxide thickness, for example 75%.

In a method according to the invention, a step of cleaning at least one of the substrates, and preferably both substrates, may precede the bringing into contact of the oxide layers and the assembly of the substrates. An etching of the oxide may then take place, leading to a reduction in the thicknesses of the treated oxide layers. To offset this reduction in the thicknesses of the oxide layers, the initial thicknesses of the oxide layers are chosen so as to obtain, after cleaning, thicknesses of oxide according to the invention and particularly according to the proportions indicated above. The cumulative thickness of the two oxide layers formed initially is then greater than the thickness of the buried oxide of the final device. After such a cleaning, the structure of the insulator material is unchanged, the oxide is always made of material forming barrier to the diffusion of water. In other words, the bonding oxide and donor oxide layers are preferably formed with a total thickness greater than the thickness of the buried oxide layer, the step of cleaning causing a reduction in the thickness of the insulator layer present on the cleaned substrate.

In a method according to the invention, the donor substrate and/or the final substrate may be made of semi-conductor material, for example silicon. At least one of the two substrates, and possibly both of them, may be made of quartz, or sapphire or of a polymer. The final substrate can be made of a material, for example a semi-conductor material, different from the material of the donor substrate. It can be made of a material with a thermal expansion coefficients (TEC) different from the one of the donor substrate or made with another material X for which there is a reaction of the type $H_2O + X \to XO_2 + H_2$, or forming another gaseous reaction product.

The donor substrate may then be thinned by fracture of the substrate, for example of the kind known under the name of Smart-Cut®. This method may be carried out under the conditions described for example in the article of B. Aspar and A. J. Auberton-Hervé "Silicon Wafer Bonding Technology for VLSI and MEMS applications", edited by S. S. Iyer and A. J. Auberton-Hervé, 2002, INSPEC, London, Chapter 3, pages 35-52.

The thinning can take place during a heat treatment at a temperature less than 350° C. or 400° C.

Advantageously, the fracture of the substrate may be carried out during a low temperature heat treatment, for example at a temperature below 400° C.; more details are given below.

A heat treatment, known as annealing, with a temperature between 700° C. and 1300° C., preferentially between 900° C. and 1200° C. and with a temperature increase ramp greater than 10° C./s or advantageously greater than 20° C./s may be applied after the thinning so as to consolidate the bonding interface and minimise the exposure time of the device to temperatures between 400° C. and 700° C. and advantageously between 400° C. and 900° C., which correspond to the temperature range in which the blisters formation kinetic is high and is the least favourable to the quality of the final semi-conductor structure.

Annealing at a temperature above 700° C. or preferentially above 900° C. enables an evacuation of the captive hydrogen, present at the bonding interface or at the interfaces between the substrates and the oxide layers, by diffusion in the semi-conductor material.

In the temperature interval 400° C.-900° C., for silicon, there is formation of blisters due to the release of gaseous hydrogen. The resulting pressure deforms the materials of the two bonded substrates and forms blisters and may cause the rupture of the final structure during subsequent treatments or during the fracture heat treatment of the substrate or consolidation heat treatment. A high temperature ramp, as mentioned above (at least 10° C./s), makes it possible to minimise the passage in this critical temperature interval and thus makes it possible to attain the temperature of diffusion of hydrogen in the semi-conductor material (close to 900° C.) before the pressure in the blisters weakens the device in an irremediable manner.

It should be noted that the critical temperature interval mentioned mainly depends on the thickness of the superficial layer and the type of material. For example, for a thickness of a silicon superficial layer of less than 10 nm, this critical interval may be between 350° C. and 700° C. instead of the interval 400° C.-900° C. for a device having an oxide layer between 10 and 20 nm. This interval is also going to vary if the substrates used are based on SiGe or AsGa or another semi-conductor material. But here it is also aimed to:

optimise the distribution of the thicknesses of the insulator layers forming a barrier to the oxide diffusion or limiting this diffusion, minimise the thermal treatment times included in the critical temperature interval.

Tests can enable to identify the critical temperature interval more precisely if a method according to the invention is applied.

DETAILED DESCRIPTION OF SPECIFIC EMBODIMENTS

Figure 1A:
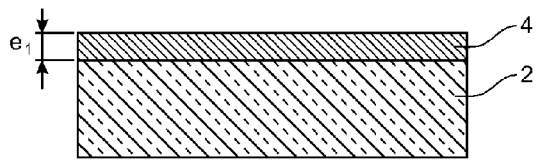
FIGS. 1A to 1F represent a first embodiment of a method according to the invention.
Figure 1B:
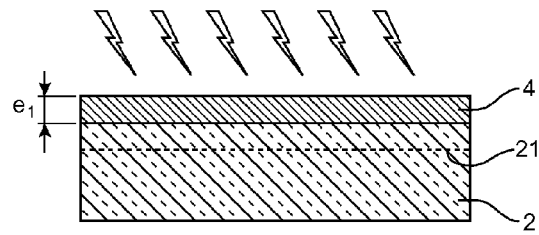
Figure 1C:
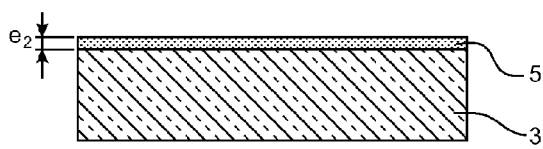

The invention relates to a method for producing systems of stacked SOI type semi-conductor layers and, more specifically, UTBOX type, in other words with ultra thin thickness of buried insulator layer.

The method is illustrated according to two embodiments in FIGS. 1A to 1F and 2A to 2G, any reference corresponding to a same element in the different figures.

The first embodiment (FIGS. 1A to 1F) relates to a method for producing SOI structures with thin buried insulator layer, thinner than 50 nm; advantageously this insulator layer is less than 20 nm, and preferentially less than 15 nm, it may also be less than 10 or 7 nm.

The insulator is preferentially an electrical insulator, it may be a nitride layer or may advantageously be an oxide layer, for example a silicon oxide. In the remainder of the description, the example of oxide layers is taken but this is not limitative. As explained previously, in a method according to the invention, during the bonding, the insulator layer is made of a material capable of forming barrier to the diffusion of water or to limit this diffusion.

According to the first embodiment of a method according to the invention, a thin oxide layer 4 is formed at the surface of a substrate (FIG. 1A), known as donor substrate 2, which is for example made of semi-conductor material, advantageously silicon. This oxide layer, known as donor oxide layer, has a thickness e1 and may be formed for example by thermal oxidation of the donor substrate 2 or if necessary by oxide deposition.

Preceding or following the formation of the donor oxide layer 4, doping elements are introduced into the donor substrate, to form a weakened layer 21, advantageously this is done through an implantation of atomic or ionic elements, for example a co-implantation of helium and hydrogen (FIG. 1B), for example through the donor oxide layer 4.

This weakened layer 21 may advantageously be introduced in anticipation of a thinning by substrate fracture. For this embodiment of the invention as well as for the following embodiments, this method of substrate fracture may be of the "Smart Cut™" substrate fracture method kind. This method is described for example in the article of B. Aspar and A. J. Auberton-Hervé "Silicon Wafer Bonding Technology for VLSI and MEMS applications", edited by S. S. Iyer and A. J. Auberton-Hervé, 2002, INSPEC, London, Chapter 3, pages 35-52.

The densities of each of the doping elements introduced may be advantageously between $1.10^{+16}$ at.cm$^{-3}$ and $1.10^{+19}$ at.cm$^{-3}$. The implantation dose then used, in the order of $1.10^{+14}$ at.cm$^{-2}$ to $1.10^{+16}$ at.cm$^{-2}$, is adapted to the thickness e1 of the donor oxide layer, to the density planned for each doping element, and to the requisite thickness of semi-conductor material 20 after the fracture.

Then, or in parallel, or before the operations described previously, a thin oxide layer 5, known as bonding oxide layer, is formed on a second substrate, known as final substrate 3, for example by thermal oxidation of the final substrate 3 or if necessary by deposition of this oxide. This oxide layer has a thickness e2 less or equal to the thickness of the donor oxide layer. This substrate is advantageously made of semi-conductor material but may also be made of another material, for example quartz or any type of substrate made of a material X in which the bonding reaction leads to an oxidation of the type: $H_2O + \text{materials } X \rightarrow XO_2 + H_2$, or any other gaseous reaction product.

Figure 1D:
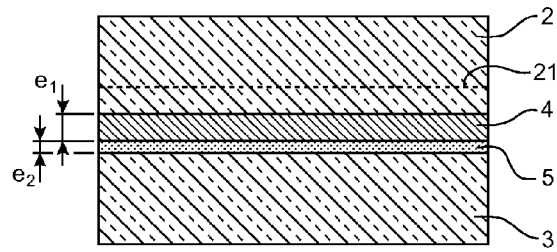

The two substrates 2 and 3 are then assembled, the donor oxide layer 4 and the bonding oxide layer 5 being brought into contact (FIG. 1D). An oxide-oxide type bonding then takes place, generating an oxide layer, known as final oxide or buried oxide layer, situated between the two substrates 2 and 3 and composed of the donor oxide 4 and bonding oxide 5 layers (in FIG. 1F, this composite layer is represented by the buried oxide layer 45).

The buried oxide layer thereby obtained thus has a thickness $e_t$ less than or equal to 50 nm, advantageously less than or equal to 20 nm, preferentially less than or equal to 15 nm, for example 11.7 nm. The distribution of the thicknesses of the oxide layers to be assembled is such that the relative thickness of the portion of the buried oxide layer 45 derived from the donor oxide layer 4 may be equal to 50% or, in the case where the introduction of doping elements takes place through the donor oxide layer, strictly greater than 50% and less than or equal to 95% of the cumulative thickness of the oxide layers to be assembled.

Within the scope of the invention, "relative thickness of the donor oxide layer compared to the buried oxide layer" designates the ratio between the thickness of the donor oxide layer and the thickness of the buried oxide layer. In the case where no details are given, the relative thickness of a layer A is the relative thickness of the layer A compared to the buried oxide layer.

In a method according to the invention, the oxide layers are formed either by a step of controlled oxidation—for example by exposure of the substrate to an oxygen rich environment and at high temperature, or by a deposition of oxide, for example by CVD or by ALD. Conversely, a native oxide layer, derived from the simple exposure of the substrate to the surrounding atmosphere, is not suitable as such. Indeed, this oxide is relatively porous and cannot form an efficient diffusion barrier layer. Nevertheless, it may be envisaged to confer on this native oxide layer this characteristic of "diffusion barrier", by carrying out an annealing, known as densification annealing, for example under neutral atmosphere, between 200° C. and 800° C. for a time that can extend from several minutes to several hours. Generally speaking, it is preferable to carry out this densification annealing for native oxides and for certain deposited oxides that may have a level of porosity rendering them incapable of forming an efficient water diffusion barrier.

In the case where the introduction of doping elements takes place through the donor oxide layer, this relative thickness of the portion of the buried oxide layer 45 derived from the donor oxide layer 4, is advantageously between 60% and 95% and preferentially between 70% and 80% of the cumulative thickness of the oxide layers assembled during the bonding, in other words the thickness of the buried oxide layer. For example, the thickness e1 of the donor oxide to assemble 4 may be 8.4 nm if the thickness e2 of bonding oxide to be assembled 5 is 3.3 nm. In a method according to the invention, the thickness of the buried oxide layer may also be less than 10 nm or less than 7 nm.

Figure 1E:
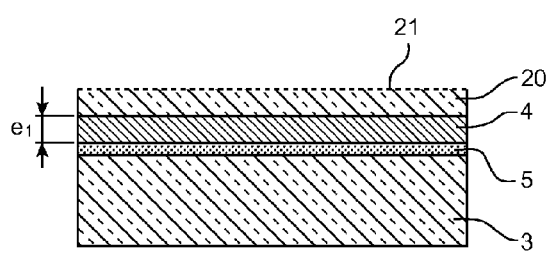

In a method according to the invention, the device composed of assembled substrates 2 and 3, as well as their different superficial layers, may then be subjected to an annealing so as to fracture the donor substrate at the level of the weakened layer 21 (FIG. 1E). The rupture method may for example be adapted so that the annealing temperature does not exceed 400° C., and advantageously does not exceed 350° C.

Figure 1F:
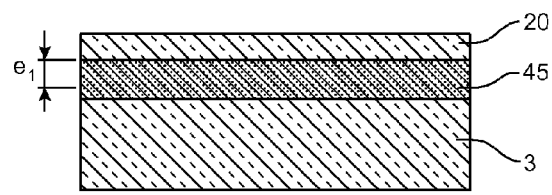

Then, the fractured surface may if necessary be polished (FIG. 1F).

The bonding interface may be consolidated by an annealing, before or after the polishing.

Advantageously, after rupture of the donor substrate, but before or instead of any consolidation annealing of the bonding interface, the semi-conductor structure obtained may be subjected to a stabilisation annealing of the interface at temperature between 700° C. and 1300° C., preferentially between 900° C. and 1200° C., the increase in temperature taking place with a temperature ramp greater than 10° C./sec, and preferentially greater than 20° C./sec. This step of stabilisation annealing may take place after the polishing step. Advantageously this annealing takes place before the polishing step, after the substrate rupture step.

As explained above, this annealing between 700° C. and 1300° C., preferentially between 900° C. and 1200° C. enables the diffusion of gaseous hydrogen through the substrates. A high temperature ramp, as mentioned above (at least 10° C./s) makes it possible to minimise the passage time in the critical temperature interval of 400° C.-700° C. and advantageously between 400° C. and 900° C. during the increase in temperature and thus makes it possible to attain the above mentioned hydrogen diffusion temperature interval before the pressure in the blisters weakens the final semi-conductor structure in an irremediable manner. Thus, the parameters of the annealing are controlled in order to limit the exposure time, in the range 400° C.-700° C. and advantageously in the range 400° C.-900° C., to less than 120 seconds, for example preferentially around 30 seconds or less than 30 seconds. The critical time allowed according to the invention in the temperature range is a function of the thickness of the buried oxide layer 45 of the final structure: the thinner it is, the more it is aimed to limit the exposure time. For a thickness of 10 nm, the maximum exposure time in the critical temperature interval, for a method according to the invention, is between 20 and 30 seconds; for 15 nm this time is less than 30 seconds and for a thickness of oxide of 25 nm the critical time is close to 2 minutes or even more.

A second embodiment of the invention is described in FIGS. 2A to 2G. The principle of this embodiment is identical to that of the first embodiment, apart from the deposited thicknesses e1' and e2' of the oxide layers 4', 5'.

In this embodiment of the invention, the total thickness of oxide deposited (e1'+e2') is higher than the final thickness of oxide ($e_t$) targeted for the buried oxide layer 45 of the final structure. Only the steps different from the first embodiment of the invention will be described, the layer 45 of FIG. 2G being composed of layers of donor oxide 4 and bonding oxide 5 represented in FIGS. 2D to 2F and obtained after the thinning of the oxide layers 4' and 5'.

Figure 2A:
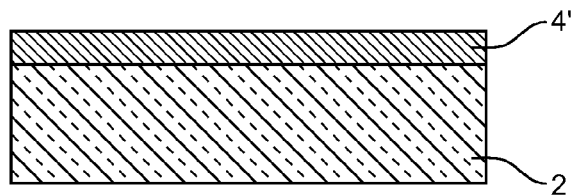
FIGS. 2A to 2G represent a second embodiment of a method according to the invention, in which thicknesses of oxide higher than the requisite thickness for the final device are formed.
Figure 2B:
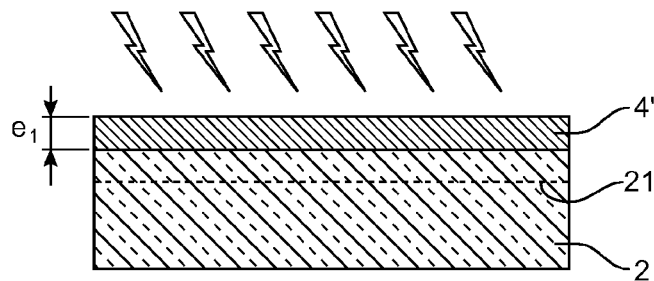
Figure 2C:
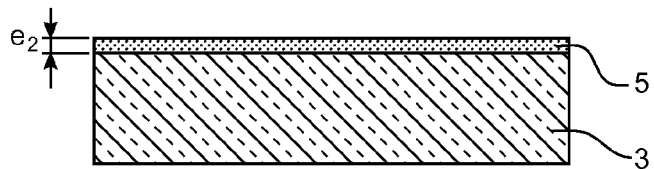
Figure 2D:
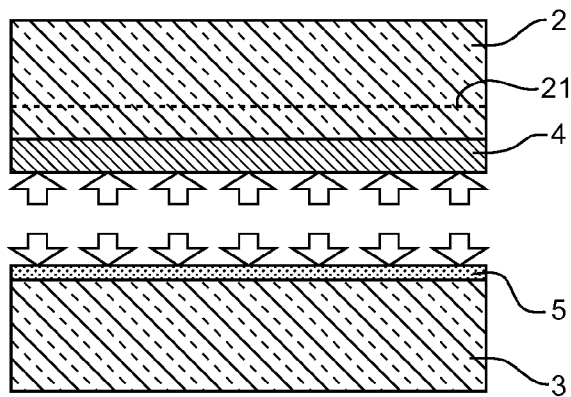
Figure 2E:
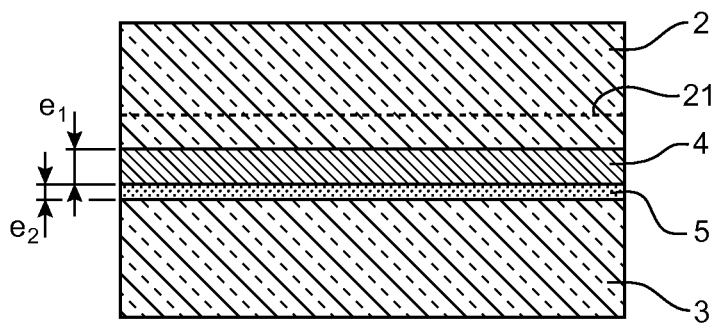
Figure 2F:
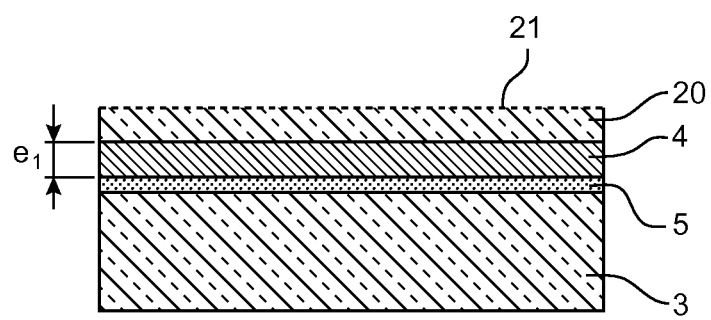
Figure 2G:
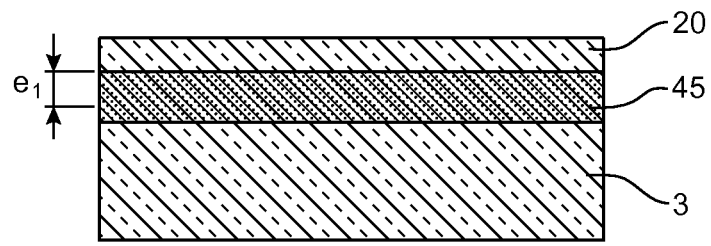

Preceding the bonding step, illustrated in FIG. 2E, one and/or the other of the substrates 2, 3 each comprising an oxide layer, respectively 4' and 5' of thicknesses e1' and e2', is subjected to a step of cleaning, described in FIG. 2D, the cleaning having, among others, the effect of etching, and thus thinning, the oxide layer 4' and/or 5' present at the surface of the substrate(s) treated by the cleaning.

However, the insulator layers, for this cleaning or for any other step of the method, are not subjected to any treatment favouring the diffusion of water in all or part of the insulator layers. In particular, the plasmas carried out before bonding for the purpose of improving the adherence during the bonding are excluded in the method according to the invention, these steps seeming to favour the diffusion of water through the insulator layers.

Preferentially, the initial thickness (e1' and/or e2'), during the formation of the donor oxide 4' or bonding oxide 5' layers, takes account of the thinning produced during the cleaning step if any and of the requisite final thicknesses e1 and e2 for the donor oxide 4 and bonding oxide 5 layers. As in the first embodiment, the final thickness of oxide $e_t$ of the buried oxide layer 45 is less than or equal to 50 nm, advantageously less than or equal to 20 nm, preferentially less than or equal to 15 nm, or for example less than 10 nm or 7 nm. In addition, after the cleaning and thinning of the initial oxide layers, the thicknesses e1 and e2 of the oxide layers 4 and 5 to be assembled during the bonding are such that the relative thickness, compared to the cumulative thickness of the two oxide layers during the bonding, of the oxide layer 4 deriving from the donor oxide layer 4' is 50% and/or, in particular in the case where the introduction of doping elements takes place through the donor oxide layer, strictly greater than 50% and less than or equal to 95% of the cumulative thickness $e_t$ of the oxide layers 4,5 to be assembled. This relative thickness of the donor oxide layer to be assembled is advantageously between 60% and 80% and preferentially between 70% and 80% of the cumulative thickness $e_t$ of the oxide layers to be assembled, for example 75%.

In a method according to the invention, using an oxide-oxide bonding with a thickness of donor oxide at least greater than or equal to the thickness of bonding oxide during the assembly of the substrates makes it possible to limit water molecules and materials present under the oxide layers being brought into contact. This is true only if the oxides have preserved their water diffusion barrier property, i.e. that they have undergone no treatment that reduces the water diffusion barrier property or that the donor oxide layer or both oxide layers have been subjected to an ionic implantation step with a dose smaller than $6 \cdot 10^{16}$ at/cm$^2$, or even smaller than $3 \cdot 10^{16}$ at/cm$^2$. Thus, the immediate formation of hydrogen radicals by reaction with the semi-conductor material is blocked, the formation of hydrogen radicals being due to the possible diffusion of molecules of water through the oxide layers. In advantageous embodiments of methods according to the invention, the oxide layers 4', 5' have relative thicknesses, compared to the thickness $e_t$ of the buried oxide layer 45, such that, during the bonding, the relative thickness of the donor oxide layer 4 is strictly greater than 50% and less than or equal to 95%, advantageously between 60% and 85% and preferentially between 70% and 80%.

This distribution of the thicknesses of oxide composing the buried oxide layer between the donor substrate 2 and the receiver substrate 3 makes it possible to have a higher thickness of oxide on the side of the donor oxide 4. This makes it possible to compensate for defaults in the donor oxide 4; this oxide being degraded during the introduction of doping elements (FIGS. 1B and 2B), its properties of barrier to the diffusion of H$_2$O are reduced. The bonding oxide layer having non deteriorated barrier properties, it is not necessary for it to have a high thickness to form a diffusion barrier equivalent to that formed by the donor oxide layer. A thickness of the bonding oxide layer of 0.5 nm to 5 nm or 10 nm, for example 1 nm may be sufficient to form an efficient diffusion barrier. In this case, it may be advantageous to limit the global doping element dose introduced during the implantation step through the donor oxide layer 4. It is thus possible to limit this global dose to less than $3 \cdot 10^{16}$ at/cm$^2$.

By creating, according to the invention, a donor oxide layer 4 thicker than the bonding oxide layer 5, it is possible, without changing the final thickness $e_t$ of the buried oxide layer 45, to increase the barrier effect of the portion of the buried oxide layer deriving from the donor oxide layer 4. Thus, the thicknesses are chosen so as to obtain comparable barrier effects for the donor oxide layer 4 and the bonding oxide 5 on the side of the final substrate 3 without modifying the final thickness of the buried oxide layer 45. None of the oxide layers has been deteriorated during its manufacturing or with any other process step, save through the implantation step, if any. In particular before bonding none of the oxide layers is subject to any activation plasma.

The distribution between the thicknesses of the layers to be assembled, after any thinning, resulting for example from a cleaning step, if any, is chosen as a function of the difference in water diffusion barrier property between:
  the bonding oxide layer 5, intact, deposited on the final substrate 3, and
  the donor oxide layer 4, potentially degraded by the introduction of doping elements in the donor substrate 2.

The choice of the relative thicknesses thus depends on the implantation dose used and the materials composing the oxides used.

Figure 3:
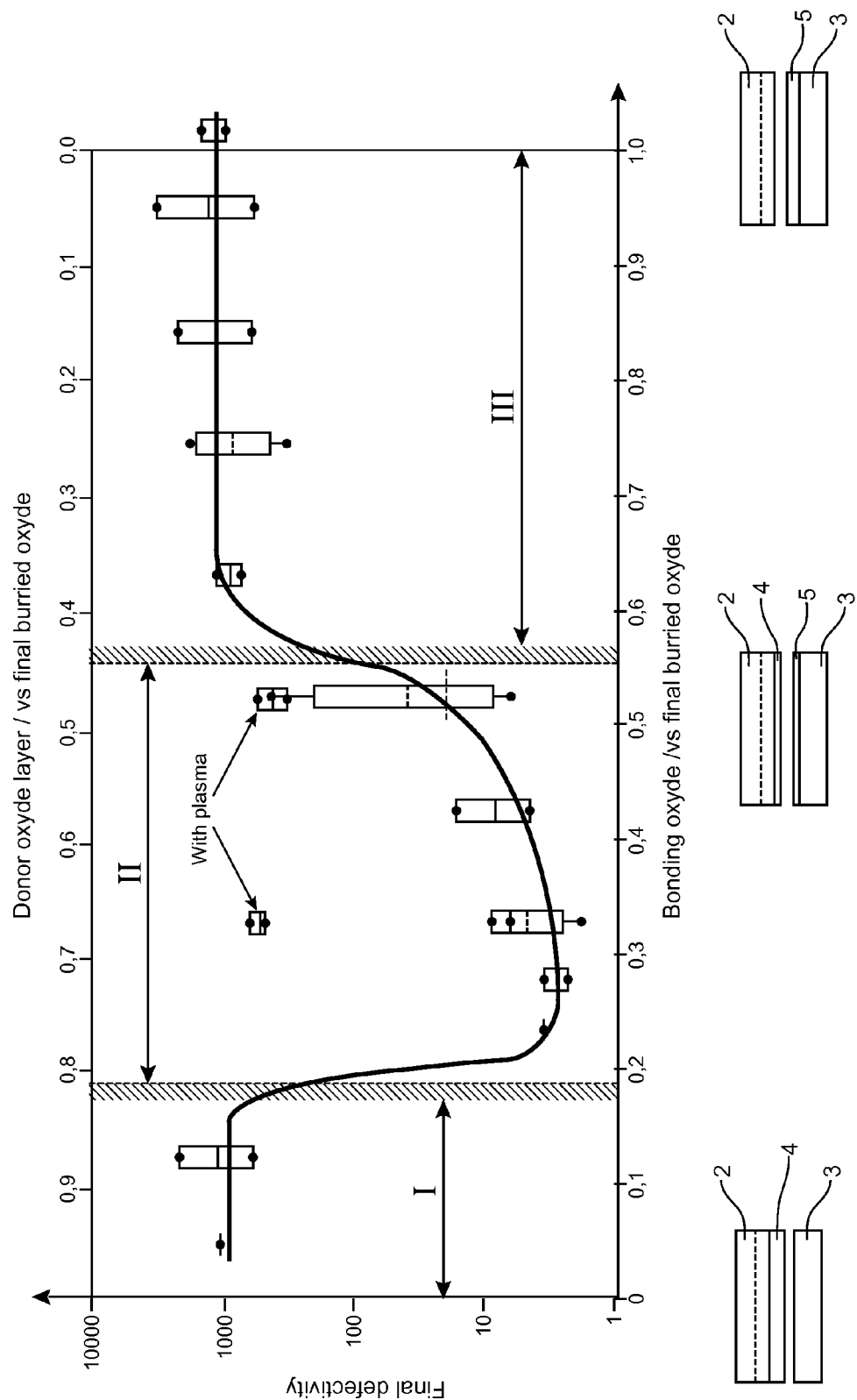
FIG. 3 illustrates results of defectiveness experiments obtained by the inventors as a function of the ratios of the thicknesses of the oxide layers compared to the final thickness of oxide in the case of $SiO_2$ and silicon substrates.

Results of experiments, obtained by the inventors, are given in FIG. 3, giving the final defectivity (in the Y-axis), after bonding and annealing, as a function of the relative thickness (in the X-axis) of the layers of donor oxide and/or bonding oxide that make up the final oxide layer, also known as buried oxide layer, in the case of UTBOX type SOI structures, based on silicon and silicon oxide.

A ratio between the thickness of the bonding oxide layer and the thickness of the final oxide layer (lower X-axis on this graph) equal to "0" corresponds to the case where the final oxide layer derives uniquely from the donor oxide formed on the donor substrate before bonding and assembly of the substrates.

In the same way, a ratio between the thickness of the bonding oxide layer and the thickness of the final oxide layer equal to "1" corresponds in the case where the final oxide layer derives entirely from the bonding oxide layer.

Between these two extreme values, the relative thickness of the bonding oxide layer compared to the thickness of the final oxide layer increases.

Also represented, at the top of the graph, is the ratio between the thickness of the donor oxide layer and the thickness of the final oxide layer. This ratio varies inversely to the ratio between the thickness of the bonding oxide layer and the thickness of the final oxide layer.

In terms of ratio between the thickness of the bonding oxide layer and the thickness of the final oxide layer, the limit between the zones I and II is situated at around 20%, and, between the zones II and III, at around 55%.

The defectiveness after bonding as a function of the ratio of the thicknesses of oxides may be distributed in three parts. In part I, the final oxide layer is mainly composed of donor oxide formed on the donor substrate; the $H_2O$ molecules easily diffuse to the surface of the final substrate and form, during annealings, critical defects in large quantity at the interface between the final substrate and the final oxide layer, also known as buried oxide layer.

In part III, the thickness of the bonding oxide layer is greater than the thickness of the donor oxide layer, the efficiency of which, as barrier, is already deteriorated by the elements introduction step, for example during an ion implantation step. A high defectiveness is observed, the barrier properties of the donor oxide layer 4 being very inferior to that of the bonding oxide layer 5 and then allowing too many $H_2O$ molecules to diffuse to the donor substrate 2, which form, during the annealing, numerous "blister" type defects.

The effect of barrier to the diffusion of water of the final oxide layers is insufficient in the two cases illustrated by parts I and III of FIG. 3.

In part II, the distribution of the thicknesses of the oxide layers to be assembled, before bonding, here a relative thickness of the bonding oxide layer between 15% and 50%, i.e. respectively a relative thickness of the donor oxide layer between 95% and 50%, is such that the barrier properties of the donor oxide layer 4 are improved on account of a higher relative thickness. The bonding oxide layer 5 has, in this part II, a sufficient thickness to form, on the side of the final substrate 3, a barrier to the diffusion of $H_2O$ of efficiency comparable to that formed on the side of the donor oxide.

There is thus an important effect of the ratio of the thicknesses on the defectiveness after annealing and thus on the efficiency of the insulator-insulator bonding, in particular in the case of an oxide-oxide bonding, to block, or at least to limit, the diffusion of $H_2O$ molecules trapped in the buried oxide layer during the assembly.

The data of this figure clearly illustrate that the oxide-oxide bonding, at equal thicknesses of oxides for example, or more specifically an oxide-oxide bonding with an optimised ratio of thicknesses of oxides, enables the problems linked to the diffusion of $H_2O$ to be resolved, in particular the formation of "blister" type defects. Such a method according to the invention thus makes it possible to form UTBOX-like devices with a lower acceptable defectiveness than the defectiveness of structures obtained by the method according to the prior art, in which all the oxide composing the buried final oxide layer derives from the donor oxide layer. Under the conditions used to obtain these experimental results, an advantageous interval has been identified for a relative thickness of donor oxide between 60% and 85%.

The plot of such a figure makes it possible, within the scope of a method according to the invention, to find the optimum for the relative thicknesses of oxide for a given thickness $e_t$ of final oxide 45, given materials and a given ion implantation. This optimum is here between 70% and 80% of donor oxide, and more specifically close to 75%.

The level of defectivity obtained when a plasma treatment is applied before bonding, on both oxide layers to be bonded, for a bonding oxide thickness/final oxide thickness ratio of around 33% and around 53% is also represented. It may be seen that, for a same bonding oxide thickness/final oxide thickness ratio, a plasma treatment leads to a very clear degradation of the final structure, with defects more numerous by a factor close to 100.

Figure 4:
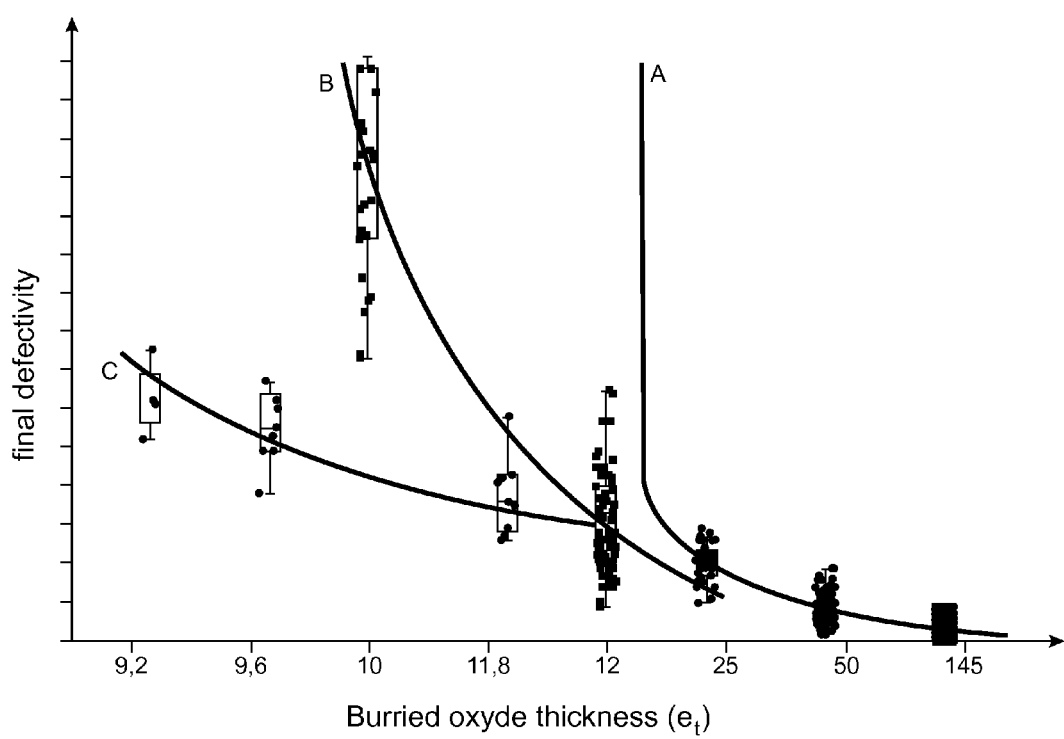
FIG. 4 illustrates results of defectiveness experiments as a function of the thickness of the final oxide layer, obtained by the inventors and showing the efficiency of a method according to the invention to create UTBOX structures having a low oxide thickness.

The efficiency of the invention is illustrated by defectiveness analyses (FIG. 4), obtained for SOI or UTBOX-like structures based on silicon and silicon oxide, which show that the method of integration by an oxide-oxide bonding, in particular with identical oxide thicknesses (curve B), enables to obtain an improved reliability and thus to develop thinner UTBOX structures than with the known method. It is still possible to reduce the dimensions of the buried oxide layer and/or to obtain a lower defectiveness if the integration method used is that according to the invention (curve C), comprising a dissymmetry of thicknesses of the oxide layers to be assembled with a distribution within the intervals described previously.

In particular, the effect obtained compared to the known method is important for a thickness of the buried oxide layer $e_t$ less than 15 nm and considerable for thicknesses of buried oxide less than 10 nm.

Thus, the lower the final thickness of buried oxide, the more a method according to the invention has effect relative to the methods of the prior art.

The techniques according to the invention described above may further be improved to obtain a very thin insulator layer, of thickness for example less than 10 nm or 5 nm, of very good quality, for example an SOI having an oxide layer of the indicated thickness.

To this end, a structure according to a method according to the invention is produced, the insulator being an oxide layer, for example of thickness less than 10 nm or between 15 nm and 20 nm.

The partial dissolution of this oxide is then carried out to bring its thickness to the final requisite value, to less than 10 nm.

A dissolution technique is known from the document of O. Kononchuk et al. "Internal dissolution of Buried Oxide in SOI wafers", Solid State Phenomena, Vol. 131-133, p. 113-118, 2008 or US2005/00118789.

For example, the structure is treated in a neutral atmosphere, comprising for example argon, and/or a hydrogen reducing atmosphere, having a very low oxygen concentration (<1 ppm), and at a temperature substantially between 1100° C. and 1200° C. and for a duration of between some minutes (for example 2 min or 5 min or 10 min or 20 min or 30 min) and some hours (for example 1 h or 2 h or 5 h or 10 h) for example. During this heat treatment, the oxygen present in the buried oxide layer is dissolved in the treatment atmosphere through the thin film of semiconductor material. This one is for example made of silicon, the oxide layer $SiO_2$ dissolved is then transformed into Si of good quality.

In the case of an SOI having a buried oxide of 20 nm, obtained according to one of the techniques according to the present invention, a thinning of the oxide to a final thickness chosen for example at 5 nm may be obtained.

Advantageously, this heat treatment under neutral atmosphere and at very low oxygen concentration is continued at least until the whole thickness of the oxide layer formed on the side of the donor substrate is dissolved. This particular treatment can indeed induce the formation of highly uniform, high quality bonded structures (regarding the defect density), with extremely thin buried oxide layers of about few nanometres. Furthermore, the disappearance of the bonding interface in the buried oxide layer, all the oxide coming from the donor oxide layer being dissolved, enables to secure a high electrical quality of the buried oxide layer. The remaining oxide layer is constituted of oxide coming from the bonding oxide layer.

What is claimed is:

1. A method for reducing defect densities at a bonding interface when producing a stacked structure having an ultra thin buried oxide (UTBOX) layer, which comprises:
    forming a diffusion barrier of a first electrical insulator layer of a thermal oxide on a first substrate at a thickness sufficient to prevent or reduce water diffusion therein;
    introducing elements into the donor substrate through the first electrical insulator layer to form a weakened layer in the donor substrate;
    forming a diffusion barrier of a second electrical insulator layer of a thermal oxide on a second substrate at a thickness sufficient to prevent or reduce water diffusion therein, with the second electrical insulation layer being the same in thickness or thinner than the first electrical insulation layer;
    bonding the first and second substrates together without previously subjecting the substrates or insulator layers to plasma activation by contacting the first and second electrical insulator layers together to form the UTBOX layer between the two substrates, wherein the UTBOX layer has a thickness of less than 50 nm,
    wherein the first electrical insulator layer has, during bonding, a thickness which is greater than 50% up to 95% of the thickness of the buried oxide layer.

2. The method according to claim 1, wherein the thickness during bonding of the first electrical insulator layer is between 60% and 85% of the thickness of the buried oxide layer.

3. The method according to claim 2, wherein the thickness during bonding of the first electrical insulator layer is between 70% and 80% of the thickness of the buried oxide layer.

4. The method according to claim 1, wherein the thickness of the buried oxide layer is less than 20 nm.

5. The method according to claim 4, wherein the thickness of the buried oxide layer is less than 15 nm.

6. The method according to claim 1, wherein the donor substrate comprises silicon or another semi-conductor material.

7. The method according to claim 1, wherein the second substrate comprises silicon or another semi-conductor material.

8. The method according to claim 1, which further comprises, after bonding, thinning of the donor substrate according to a method in which the maximum temperature is 400° C. and comprising at least one fracture of the donor substrate at the weakened layer.

9. The method according to claim 8, which further comprises applying a heat treatment having a temperature between 900° C. and 1200° C., with a temperature increase ramp that is greater than 10° C/s being applied after bonding and after thinning 10. The method according to claim 1, which further comprises applying a heat treatment having a temperature between 900° C. and 1200° C., with a temperature increase ramp that is greater than 10° C/s being applied after bonding.

11. A method for reducing defect densities at a bonding interface when producing a stacked structure having an ultra thin buried oxide (UTBOX) layer, which comprises:
    forming a first electrical insulator layer on a first substrate at a thickness sufficient to prevent or reduce water diffusion therein;
    introducing elements into the donor substrate through the first electrical insulator layer to form a weakened layer in the donor substrate;
    forming a second electrical insulator layer on a second substrate at a thickness sufficient to prevent or reduce water diffusion therein, with the second electrical insulation layer being the same in thickness or thinner than the first electrical insulation layer;
    bonding the first and second substrates together without previously subjecting the substrates or insulator layers to plasma activation by contacting the first and second electrical insulator layers together to form the UTBOX layer between the two substrates, wherein the UTBOX layer has a thickness of less than 50 nm,
    wherein the formation of at least one of the electrical insulator layers, is achieved by deposition, by reaction, or by formation of a native oxide, and which further comprises, before bonding, conducting a densification annealing to confer the ability of the layer to act as a water diffusion barrier or to render the layer capable of limiting water diffusion.

12. The method according to claim 1, wherein the layers are bonded together without previously being subjected to treatments for modifying the insulator layers by introducing doping elements, cleaning or conducting densification annealing.

13. The method according to claim 1, which further comprises, after bonding, thinning the buried oxide layer by treatment in an atmosphere having an oxygen concentration of less than 1 ppm and at a temperature substantially between 1100° C. and 1200° C.

14. A method for reducing defect densities at a bonding interface when producing a stacked structure having an ultra thin buried oxide (UTBOX) layer, which comprises:
    forming a first electrical insulator layer on a first substrate having a thickness sufficient to prevent or reduce water diffusion therein;
    introducing elements into the donor substrate through the first electrical insulator layer to form a weakened layer in the donor substrate;

forming a second electrical insulator layer on a second substrate while conducting a densification annealing of the second electrical insulator layer to provide a diffusion barrier having a thickness and a porosity sufficient to prevent or reduce water diffusion therethrough, with the second electrical insulation layer being the same in thickness or thinner than the first electrical insulation layer;

bonding the first and second substrates together without previously subjecting the substrates or insulator layers to plasma activation by contacting the first and second electrical insulator layers together to form the UTBOX layer between the two substrates, wherein the UTBOX layer has a thickness of less than 50 nm.

* * * * *